United States Patent
O'Hora

(10) Patent No.: US 10,203,738 B2
(45) Date of Patent: Feb. 12, 2019

(54) ENERGY VIRTUALIZATION LAYER FOR COMMERCIAL AND RESIDENTIAL INSTALLATIONS

(71) Applicant: SynCells, Inc., Boston, MA (US)

(72) Inventor: Gerard O'Hora, Brighton, MA (US)

(73) Assignee: SYNCELLS, INC., Boston, MA (US)

( * ) Notice: Subject to any disclaimer, the term of this patent is extended or adjusted under 35 U.S.C. 154(b) by 0 days.

(21) Appl. No.: 15/621,268

(22) Filed: Jun. 13, 2017

(65) Prior Publication Data

US 2018/0356867 A1 Dec. 13, 2018

(51) Int. Cl.
*G05B 15/02* (2006.01)
*G06F 1/28* (2006.01)
(Continued)

(52) U.S. Cl.
CPC ............ *G06F 1/28* (2013.01); *G01C 21/3469* (2013.01); *G01R 22/06* (2013.01); *G06F 1/32* (2013.01); *G06Q 10/06* (2013.01); *G06Q 50/06* (2013.01)

(58) Field of Classification Search
CPC ........ H02J 2003/143; H02J 3/383; H02J 7/00; H02J 7/0027; G05B 15/02; G06Q 10/00;
(Continued)

(56) References Cited

U.S. PATENT DOCUMENTS 2,938,686 A 5/1960 Winkle et al.
5,756,227 A 5/1998 Suzuki et al.
(Continued)

FOREIGN PATENT DOCUMENTS

EP 2 876 702 A1 5/2015
KR 101146492 B1 5/2012
(Continued)

OTHER PUBLICATIONS

International Search Report and Written Opinion for PCT/US16/45048 dated Dec. 15, 2016, all pages.
(Continued)

*Primary Examiner* — Darrin D Dunn
(74) *Attorney, Agent, or Firm* — Kilpatrick Townsend & Stockton LLP

(57) ABSTRACT

An energy virtualization system may include a physical interface gateway that may include a plurality of common interfaces. The plurality of common interfaces may be coupled to a plurality of energy-producing devices, a plurality of energy-control devices, and a plurality of energy-consuming devices. The system may also include a building network, where the plurality of energy-producing devices, the plurality of energy-control devices, and the plurality of energy-consuming devices can communicate through building network. The system may additionally include a computing device running an energy virtualization layer. The virtualization layer may include a plurality of virtual devices representing the plurality of energy-producing devices, the plurality of energy-control devices; and the plurality of energy-consuming devices. The virtualization layer may also direct energy from the energy-producing devices to the energy-consuming devices according to information received from the energy-control devices.

18 Claims, 12 Drawing Sheets

(51) Int. Cl.
*G06F 1/32* (2006.01)
*G06Q 10/06* (2012.01)
*G06Q 50/06* (2012.01)
*G01C 21/34* (2006.01)
*G01R 22/06* (2006.01)

(58) Field of Classification Search
CPC ............... G06Q 10/06; G06Q 30/0643; Y02T 10/7283; Y04S 20/242
See application file for complete search history.

(56) References Cited

U.S. PATENT DOCUMENTS

| | | | | |
|---|---|---|---|---|
| 6,122,603 | A * | 9/2000 | Budike, Jr. | G01D 4/004 340/870.02 |
| 7,059,769 | B1 | 6/2006 | Potega | |
| 7,949,435 | B2 * | 5/2011 | Pollack | B60L 11/1811 315/80 |
| 8,359,112 | B2 * | 1/2013 | Kephart | G05B 9/03 700/25 |
| 8,406,477 | B2 * | 3/2013 | Chen | G06T 19/00 345/419 |
| 8,473,111 | B1 * | 6/2013 | Shankar | H02J 3/14 700/293 |
| 8,816,870 | B2 * | 8/2014 | Plaisted | F24D 11/003 340/657 |
| 8,830,676 | B2 | 9/2014 | Borck et al. | |
| 8,865,337 | B2 | 10/2014 | Culver et al. | |
| 8,907,811 | B2 * | 12/2014 | Windstrup | B60L 11/184 236/94 |
| 9,300,141 | B2 * | 3/2016 | Marhoefer | H02J 3/32 |
| 9,434,270 | B1 * | 9/2016 | Penilla | B60L 11/18 |
| 9,438,573 | B2 * | 9/2016 | Cregg | H04L 63/062 |
| 9,680,188 | B2 | 6/2017 | O'Hora | |
| 9,711,989 | B2 * | 7/2017 | Shin | H02J 7/007 |
| 9,716,718 | B2 * | 7/2017 | Belton, Jr. | H04M 3/2263 |
| 9,817,376 | B1 * | 11/2017 | Wartena | G05B 15/02 |
| 9,819,060 | B2 | 11/2017 | O'Hora | |
| 2002/0136042 | A1 | 9/2002 | Layden et al. | |
| 2003/0099883 | A1 | 5/2003 | Ochoa et al. | |
| 2005/0007042 | A1 | 1/2005 | Moore et al. | |
| 2006/0276938 | A1 * | 12/2006 | Miller | G06Q 50/06 700/295 |
| 2007/0127346 | A1 | 6/2007 | Goodman et al. | |
| 2007/0181547 | A1 | 8/2007 | Vogel et al. | |
| 2007/0267999 | A1 | 11/2007 | Buckley et al. | |
| 2008/0072289 | A1 * | 3/2008 | Aoki | H04L 43/0811 726/3 |
| 2008/0197199 | A1 | 8/2008 | Terlizzi et al. | |
| 2009/0096416 | A1 * | 4/2009 | Tonegawa | B60K 6/365 320/109 |
| 2009/0251925 | A1 | 10/2009 | Usui et al. | |
| 2010/0007515 | A1 * | 1/2010 | Ito | G06Q 10/06 340/6.1 |
| 2010/0017045 | A1 * | 1/2010 | Nesler | B60L 11/1824 700/296 |
| 2010/0104927 | A1 | 4/2010 | Albright | |
| 2010/0104935 | A1 | 4/2010 | Hermann et al. | |
| 2010/0245103 | A1 * | 9/2010 | Plaisted | F24D 11/003 340/657 |
| 2010/0315197 | A1 * | 12/2010 | Solomon | G06F 21/31 340/5.2 |
| 2011/0014501 | A1 | 1/2011 | Scheucher | |
| 2011/0204720 | A1 * | 8/2011 | Ruiz | B60L 11/1816 307/66 |
| 2011/0234165 | A1 | 9/2011 | Palatov | |
| 2011/0261057 | A1 * | 10/2011 | Freyhult | G06T 11/206 345/440 |
| 2011/0302078 | A1 * | 12/2011 | Failing | B60L 3/00 705/39 |
| 2012/0039503 | A1 * | 2/2012 | Chen | G06T 19/00 382/100 |
| 2012/0169511 | A1 * | 7/2012 | Windstrup | B60L 11/184 340/870.02 |
| 2013/0026972 | A1 * | 1/2013 | Luke | G07F 17/12 320/106 |
| 2013/0059182 | A1 | 3/2013 | Komatsu et al. | |
| 2013/0164567 | A1 | 6/2013 | Olsson et al. | |
| 2013/0166081 | A1 * | 6/2013 | Sanders | G05B 11/01 700/286 |
| 2013/0205372 | A1 * | 8/2013 | Gilbert | G06F 21/6218 726/4 |
| 2013/0214763 | A1 * | 8/2013 | Kubota | H02J 3/14 324/113 |
| 2013/0288083 | A1 | 10/2013 | Sweetland et al. | |
| 2013/0297084 | A1 * | 11/2013 | Kubota | H01M 10/44 700/286 |
| 2014/0015469 | A1 * | 1/2014 | Beaston | H02J 3/32 320/101 |
| 2014/0136007 | A1 * | 5/2014 | Williams | G06Q 50/06 700/295 |
| 2014/0336837 | A1 * | 11/2014 | Kiuchi | G05B 15/02 700/295 |
| 2014/0377623 | A1 | 12/2014 | Pyzza et al. | |
| 2015/0037649 | A1 | 2/2015 | Wyatt et al. | |
| 2015/0042285 | A1 | 2/2015 | Doerndorfer | |
| 2015/0048684 | A1 * | 2/2015 | Rooyakkers | H04L 9/3263 307/65 |
| 2015/0056475 | A1 * | 2/2015 | Adrian | H01M 10/4257 429/7 |
| 2015/0073608 | A1 * | 3/2015 | Ippolito | G05F 1/67 700/286 |
| 2015/0261198 | A1 * | 9/2015 | Rice | H04B 7/1851 700/83 |
| 2015/0333512 | A1 * | 11/2015 | Saussele | H02S 10/20 700/287 |
| 2015/0350818 | A1 * | 12/2015 | Hammett | H04W 4/008 700/275 |
| 2016/0003918 | A1 * | 1/2016 | Wada | H02J 3/32 320/134 |
| 2016/0033946 | A1 * | 2/2016 | Zhu | G05B 15/02 700/275 |
| 2016/0093843 | A1 | 3/2016 | Reineccius et al. | |
| 2016/0093848 | A1 | 3/2016 | DeKeuster et al. | |
| 2016/0094056 | A1 | 3/2016 | Dulle | |
| 2016/0129801 | A1 * | 5/2016 | Gale | B60L 3/0046 320/162 |
| 2016/0329710 | A1 * | 11/2016 | Clifton | H02J 3/32 |
| 2017/0033337 | A1 | 2/2017 | O'Hora | |
| 2017/0033338 | A1 | 2/2017 | O'Hora | |
| 2017/0033408 | A1 | 2/2017 | O'Hora | |
| 2017/0085438 | A1 * | 3/2017 | Link | H04L 41/046 |
| 2017/0242411 | A1 * | 8/2017 | Papadopoulos | G05B 15/02 |
| 2017/0279170 | A1 | 9/2017 | O'Hora | |

FOREIGN PATENT DOCUMENTS

| | | |
|---|---|---|
| WO | 2014/207658 A1 | 12/2014 |
| WO | 2017/023869 A1 | 2/2017 |

OTHER PUBLICATIONS

International Preliminary Report on Patentability for PCT/US16/45048 dated Feb. 6, 2018, all pages.
U.S. Appl. No. 15/225,620, filed Aug. 1, 2016, Non-Final Rejection dated Nov. 9, 2016, all pages.
U.S. Appl. No. 15/225,680, filed Aug. 1, 2016, Pre-Interview first office action dated Nov. 30, 2016, all pages.
U.S. Appl. No. 15/225,680, filed Aug. 1, 2016, First Action Interview dated Mar. 27, 2017, all pages.
U.S. Appl. No. 15/225,656, filed Aug. 1, 2016, Non-Final Rejection dated Nov. 30, 2016, all pages.
MBEAM, "The Modular Battery Exchange System: A Common Sense Approach to Full Adoption of Clean Electric Transportation," 10 pages. Retrieved from http://www.modularexchange.com/?page_id=141 Accessed on Jul. 1, 2016.

(56) References Cited

OTHER PUBLICATIONS

MBEAM, "First Updated Module," 18 pages. Retrieved from http://www.modularexchange.com/?p=314 Access on Jul. 1, 2016.
International Search Report and Written Opinion for PCT/US18/37258 dated Jul. 3, 2018, 11 pages.

* cited by examiner

ENERGY VIRTUALIZATION LAYER FOR COMMERCIAL AND RESIDENTIAL INSTALLATIONS

CROSS-REFERENCES TO RELATED APPLICATIONS

This application is related to U.S. patent application Ser. No. 15/621,364 filed on Jun. 13, 2017 entitled "Portable and Modular Energy Storage for Multiple Applications" by Gerard O'Hora, which is incorporated herein by reference.

BACKGROUND

According to the Lawrence Livermore National Laboratory, of the approximately 95 quads of raw primary energy produced in the United States, more than 58 quads were rejected/wasted due to system inefficiencies. The primary sources of energy—petroleum, natural gas, coal, etc.—are generally not directly consumed by the end user. Instead, they are used to generate electricity or to power an internal combustion engine. Electrical energy is the energy source that the vast majority of people directly interact with. It powers mobile devices, televisions, power tools, lighting, etc. In short, electrical energy can power the vast majority of end-user applications, from transportation to home/office heating.

Energy and resources are further wasted when they are restricted to a single application. The generic battery as we know it today originated in the 1800s. The standard AA battery can be used to power a remote control car or a flashlight. Although much research has been performed as of late, primarily to increase energy density, the full potential of the battery is being relegated to very specific applications, such as consumer goods, electric vehicles (EV), or grid storage, based on very restrictive expectations. Furthermore new monopolies and cartels are being created for rare-earth materials, akin to the oil industry, by inefficient use of resources, thereby undermining our energy security.

BRIEF SUMMARY

In some embodiments, an energy virtualization system may include a physical interface gateway that may include a plurality of common interfaces. The plurality of common interfaces may be coupled to a plurality of energy-producing devices, a plurality of energy-control devices, and a plurality of energy-consuming devices. The system may also include a building network, where the plurality of energy-producing devices, the plurality of energy-control devices, and the plurality of energy-consuming devices can communicate through the building network. The system may additionally include a computing device running an energy virtualization layer. The virtualization layer may include a plurality of virtual devices representing the plurality of energy-producing devices, the plurality of energy-control devices; and the plurality of energy-consuming devices. The virtualization layer may also direct energy from the energy-producing devices to the energy-consuming devices according to information received from the energy-control devices.

In some embodiments, a method of operating an energy virtualization system may include receiving a plurality of energy-producing devices through a plurality of common interfaces in a physical interface gateway of the energy virtualization system. The method may also include receiving a plurality of energy-control devices through a plurality of common interfaces in a physical interface gateway of the energy virtualization system. The method may additionally include receiving a plurality of energy-consuming devices through a plurality of common interfaces in a physical interface gateway of the energy virtualization system. The method may further include communicating between the plurality of energy-producing devices, the plurality of energy-control devices, and the plurality of energy-consuming devices through a building network. The method may also include representing the plurality of energy-producing devices, the plurality of energy-control devices, and the plurality of energy-consuming devices as a plurality of virtual devices on a virtualization layer running on a computing device. The method may additionally include directing energy from the energy-producing devices to the energy-consuming devices according to information received by the virtualization layer from the energy-control devices.

In any embodiments, any of the following features may be included in any combination and without limitation. The plurality of energy-producing devices, the plurality of energy-control devices, and the plurality of energy-consuming devices may communicate through building network according to an IP protocol. The energy virtualization system may be installed in a commercial building. The energy virtualization system may be installed in a residential building. The plurality of energy-consuming devices may include an electric vehicle. The energy virtualization layer may be configured to receive an indication that a new device has been connected to the physical interface gateway, determine whether the new device is authorized, receive information associated with a profile from the new device, and interface with the new device according to the profile. The profile may include an operating current and voltage for the new device. The operating current and voltage for the new device may be supplied by the new device to the energy virtualization system. The operating current and voltage for the new device may be provided to the new device from the energy virtualization system. The plurality of energy-consuming devices may include a heating, ventilation, and air conditioning (HVAC) system.

BRIEF DESCRIPTION OF THE DRAWINGS

A further understanding of the nature and advantages of the present invention may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

The embodiments described herein provide a system that provides and delivers—whether stored or directly delivered via a wired or wireless connection—accessible, flexible, consistent, efficient, economically simpler, and financially viable electrical energy and management in the form of a hyper-converged smart services platform. From a physical perspective, this system may be comprised of modular, interchangeable, and standardized components known as Smart Energy Modules (SEMs). These may include energy storage devices, fuel cells, computing devices, and/or any combination thereof. These SEMs can be used across a variety of platforms and applications, including home and office environments, electric vehicles, power tools, and so forth. The SEMs may be managed under a single interface and management system, making the details simple and easy to manage, as well as modular and easily upgradable. From a logical perspective, the embodiments described herein provide a "Virtualization Layer" (VL) that allows energy consumption, control, and sourcing to be dynamically virtualized with innate security capabilities.

Some embodiments described herein may be comprised of a physical layer and a virtualized middleware layer (i.e., the VL). In the physical layer, energy modules may be designed to simplify and standardize the physical embodiment of energy systems, making them easy to install, maintain, use, and swap across platforms and applications. The VL may interface with the physical layer to aggregate energy resources, determine energy needs and consumption requirements, receive and manage energy control inputs and schedules, and interface with energy consuming devices to provide energy from the energy resources.

Figure 1:
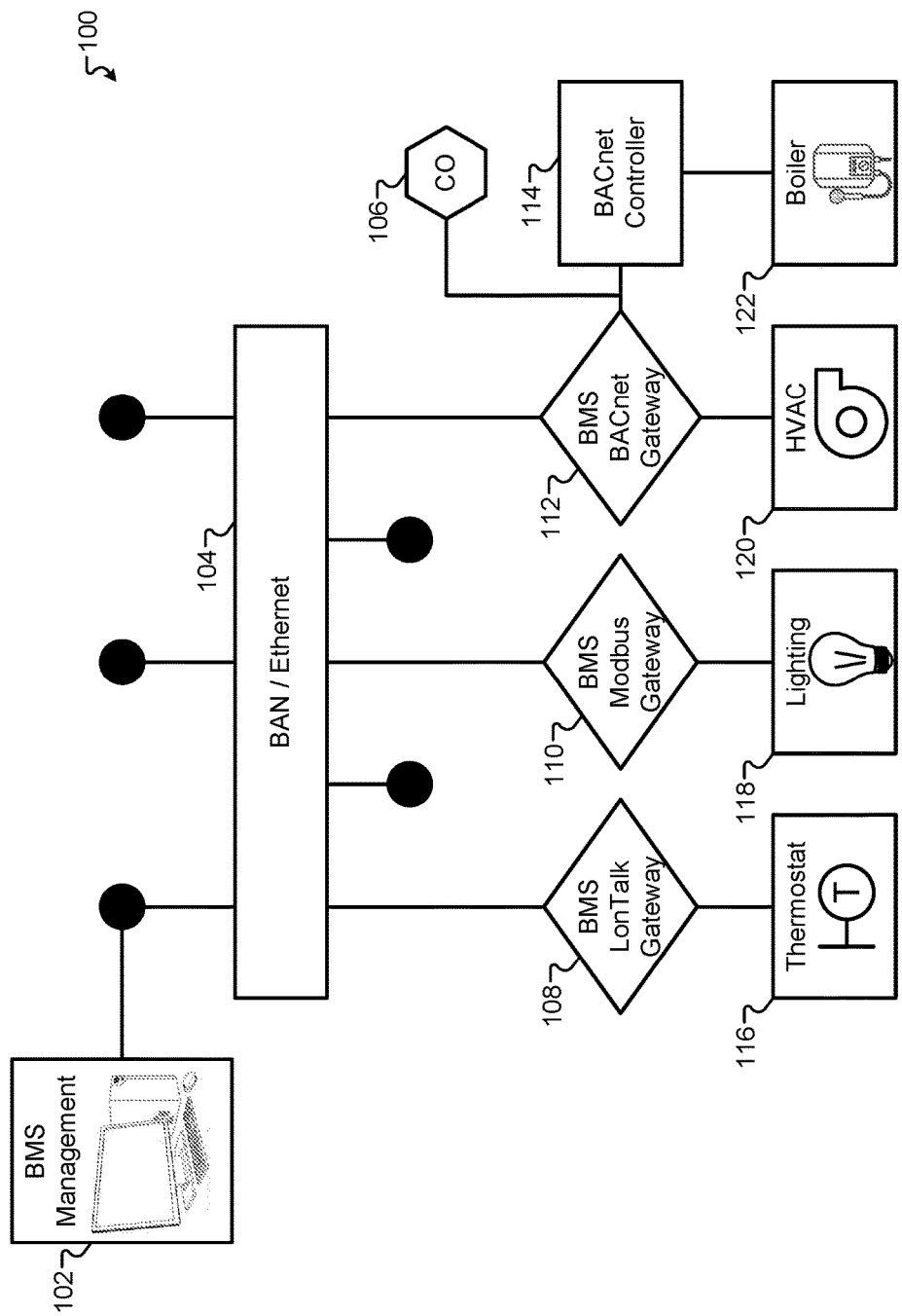
FIG. 1 illustrates an energy system in a commercial building.

FIG. 1 illustrates an energy system in a commercial building, according to some embodiments. A building management system (BMS) 102 or a building automation system (BAS) is a computer-based control system installed in buildings that controls and monitors the building's mechanical and electrical equipment, such as ventilation, lighting, power systems, fire systems, security systems, and so forth. The BMS 102 may be comprised of hardware and/or software to interact with an information bus 104, such as an Ethernet, a Building Area Network (BAN), and so forth. Prior to this disclosure, the BMS 102, a building automation system (BAS), and/or an energy management system (EMS) all followed the same basic operating principle, specifically, the systems received a user action, such as requesting more heat through a thermostat, and then facilitated a corresponding change by turning on an air-handler or other mechanical systems to increase the temperature in the area of the building in which the thermostat was located. Generally, this was accomplished through the BMS 102 as a central console. Prior to this disclosure a BMS was hard-coded with static devices which cannot keep pace with the emerging "Internet of Things" (IoT) paradigm. Energy virtualization abstracts the physical from the logical, allowing dynamic resource integration, monitoring, and management.

Through the information bus 104, the BMS 102 can communicate through a number of different gateways 108, 110, 112 with various components of the building system. These gateways 108, 110, 112 may use a variety of different serial communication protocols, such as the LonTalk protocol optimized for control, the Modbus protocol, the BACnet communication protocol specifically for building automation and control networks, and so forth. These gateways can receive and transmit information from the BMS 102 to components such as a thermostat 116, a lighting system 118, an HVAC system 120, and so forth. In addition to the gateways 108, 110, 112, a bus controller 114 can receive commands from the BMS 102 to control components such as a boiler 122. Additionally, the system may include various sensors, such as a carbon monoxide sensor 106, that provide information through a gateway 112 to the BMS 102.

In the system of FIG. 1, the BMS 102 retains total control and remains the central gateway to each of the resources in the building system. This is an understandable architecture based on the time period in which the systems were originally designed. However, this central gateway has now become a fundamental flaw in the way the system operates. Prior to this disclosure, the system of FIG. 1 was still based on a legacy hub-and-spoke model which dates back to the 1950s. Such models require centralized control, and thus have a single point of failure. The systems are also very inflexible, making changes or updates difficult, as each device must be connected back to the central controller 102. To change this requires time and money to rewire the system. From a building owner's perspective, this creates a monopolized environment where after the BMS 102 is installed, every future tenant is forced to use that BMS 102 exclusively, making it extremely unlikely that any single tenant will be motivated to replace the BMS 102 or upgrade any of the attached systems. Additionally, the security of existing BMS systems is notoriously poor. They typically do not have security built in, and depend on security provided through the network or other interfaces. This security deficiency is attributable to design engineers who are building management experts rather than security experts, as well as contractors installing systems who are not certified cybersecurity or networking professionals. Too often, these networks are exposed or not sufficiently protected, creating backdoors and opportunities to access the systems therein. Such limitations were the root cause of the retail store Target® being hacked in 2013, which resulted in the identities of over 70 million people being compromised.

Although FIG. 1 specifically shows a BMS system for a commercial installation, modern Smart Home automation vendors for residential installations have many of the same problems. The only way to provide modularity is to subscribe to a market leader, such as Google® or Apple®, which force consumers to buy their products exclusively as part of a brand ecosystem. Partners with brand ecosystems must be "certified," which limits innovation and advancements outside of a predetermined norm.

The embodiments described herein overhaul the traditional BMS system depicted in FIG. 1 through a concept described herein as "energy virtualization." The energy virtualization platform is an improvement over current technologies in that it: (1) creates an energy platform that is built on an open standard; (2) uses a highly scalable, secure, flexible, and reliable operating system that uses virtualization techniques for cross-platform support; (3) applies the virtualization concept to energy consumption in residential, commercial, automotive, retail spaces, and more; and (4) provides a lower cost of energy for the consumer, along with a lower cost of ownership for energy consuming devices and a lower cost of development for new residential/commercial infrastructures.

The overall architecture of the system described herein may be referred to as a "virtualized grid." The virtualized grid for a commercial, residential, and/or industrial installation may include a hardware/software layer referred to as the energy virtualization layer that provides a plug-and-play interface for energy providing devices, energy consuming devices, and/or energy control device. The smart grid provides a stable, local platform in which new devices can be installed, upgraded, and removed dynamically and seamlessly through the energy virtualization layer.

Figure 2:
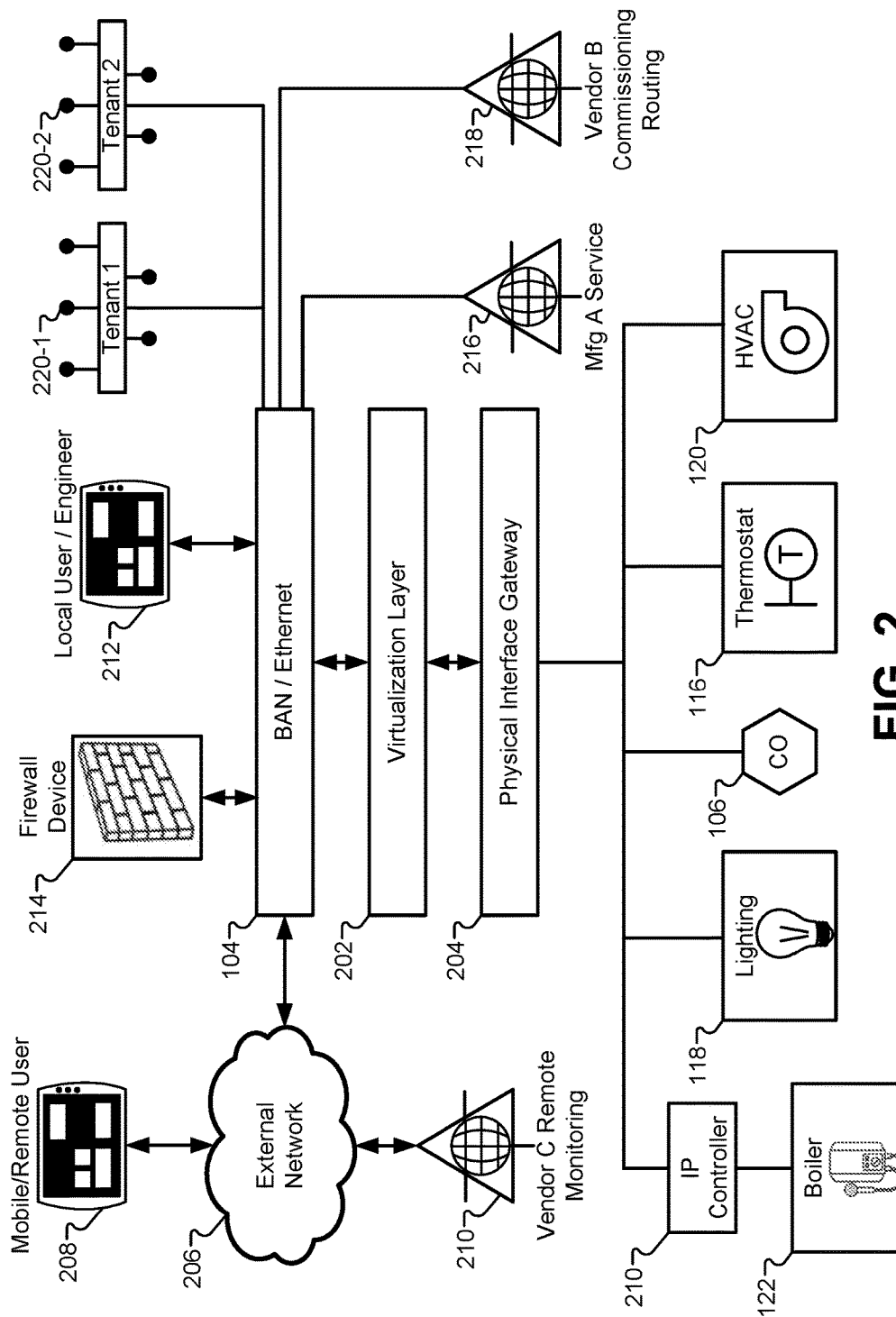
FIG. 2 illustrates an architectural diagram of a smart building virtualized management system, according to some embodiments.

FIG. 2 illustrates an architectural diagram of a virtualized grid, according to some embodiments. The software engine that runs the virtualized grid is the virtualization layer 202, which abstracts the traditional physical resources from the control systems and the user interfaces. The virtualization layer 202 acts as a virtualized middleware layer, similar to a hypervisor, to manage virtualized resources. The virtualization layer 202 may run on a small computing device, and can perform a number of functions—unlike the traditional BMS 102 depicted in FIG. 1. The virtualization layer 202 can also manage numerous control systems and support a number of different outputs, inputs, and requests in parallel. As an "open" system, the virtualization layer 202 can accept input from any authenticated device that is allowed to connect with the virtualization layer 202, provided the authenticated device conforms to the virtualized grid framework. The virtualization layer 202 acts as a hypervisor layer, and the dynamic resource pool traditionally governed by a hypervisor represents the energy devices that can be added/removed to/from the system dynamically. Analogous to traditional hardware virtualization, instead of running various operating systems on top of the hypervisor, various user interfaces or energy control devices can be run on top of the virtualization layer. Similarly, a manufacturer can run a maintenance or optimization routine on top of the virtualization layer.

The virtualized grid may also include a number of devices. These devices may include various sensors, such as the thermostat 116 and the carbon monoxide sensor 106. The thermostat 116 may also be classified as a control device, as it receives inputs from users and generates automated commands based on a difference between a setpoint temperature and an ambient temperature detected in the enclosure. Generally, sensor devices provide inputs characterizing an environment, including electrical environments, temperature/humidity/pressure environments, occupancy statuses, security system sensors, and so forth. Control devices generally provide inputs to the virtualization layer 202 that can be used to govern how the virtualization layer 202 distributes energy to the rest of the virtualized grid.

Another class of devices may include energy consuming devices, such as a lighting system 118, an HVAC system 120, and a boiler 122. Energy consuming devices may be characterized in that they receive commands from the virtualization layer 202 and consume energy provided by the virtualization layer 202. Although not shown explicitly in FIG. 2, another class of devices may include energy providing devices. Energy providing devices (or "energy producing devices") may include solar panels, wind turbines, fuel cells, battery cells, a connection to a local energy grid, and so forth. As will be described in greater detail below, each of these devices (e.g., energy control devices, energy consuming devices, energy producing devices, etc.) can be coupled to the virtualization layer 202 through a physical interface gateway 204. The boiler 122 can be connected to an IP controller 210.

As will be described in greater detail below, each device can be viewed by the virtualization layer 202 as a logical resource. Each logical resource may be associated with a profile that includes resource information, such as a serial number, product codes, licensing information, physical attributes for the actual device, operating parameters, control parameters, and so forth. When connecting to the virtualization layer 202, an authentication process may be provided in order to connect to the virtualization layer 202. Additionally, the virtualization layer 202 can poll each device periodically to determine its status and ensure that each device is in line with a current operating mode. This ensures that no unauthorized device has intercepted or piggy-backed onto the physical connection.

Analogous to today's mechanical and electrical environments, each device may include an actuator that takes electrical input and converts it to a specific mechanical action, such as turning on or opening a damper, igniting a water heater, turning on a fan, and so forth. Prior to this disclosure, that "actuator" was initiated at a BMS-proprietary controller component in which the control wiring from the BMS interfaced with the device. For example, the BMS would include proprietary wiring connections to an HVAC system 120 or to a lighting system 118. In the virtualized grid scenario of FIG. 2, this proprietary connection may be replaced with a small, in-line IP interface module that connects via the Building Area Network (BAN) 104 to communicate an action or receive a status request from the virtualization layer 202. Initially, these IP interface modules may be provided for each specific device type to conform to a uniform interface both logically at the virtualization layer 202 and physically at the physical interface gateway 204. Over time, these IP interface modules may be built into each device natively, for example, through the use of an RJ-45 data connector, to provide quick and simple plug-and-play set up. The physical layer gateway may operate according to the OSI model to govern how network-based devices communicate.

As opposed to the legacy hub-and-spoke configuration of FIG. 1, the smart grid of FIG. 2 can leverage a contemporary mesh network design that supports multiple processes, users, devices, etc. in parallel. Specifically, any resource in the system can access any other shared resource in parallel, be it an energy consuming system, energy providing system, or control system. Therefore, a failure in one node or element does not undermine the entire system. For example, operating the HVAC system 122 to achieve a desired temperature in a particular office space is not dependent on a single core system providing access and/or control to a third-party to effect a change in temperature. The virtualized grid neutralizes that concept, thus making the system less proprietary and preventing operational bottlenecks or system failure.

The virtualization layer 202 acts as a virtual interconnect for each resource in the system. The number of resources may be very large—potentially millions in a large building with every lighting device individually connected. In one example, a first tenant 220-1 can run their preferred BMS service on the smart grid to provide their building automation. This allows the first tenant 220-1 to be integrated into their headquarters BMS by relating data for cost information, and so forth. A second tenant 220-2 can run their BMS system both independently and in parallel with the first tenant 220-1. In addition to tenants, an external network 206, such as the Internet or a WAN, can provide access for a vendor 210 to remotely monitor the building system. For example, a vendor may support the building to run maintenance/upgrade routines and/or monitor a security system. In some embodiments, the vendor 210 may provide supplies and maintenance to the building itself. For example, the vendor 210 may monitor the lighting system 118 or HVAC system 120 and generate a work order when a particular lightbulb or fan coil needs to be replaced. It should be noted that this level of integration from an external vendor to an individual resource in the system is not possible in existing building management systems. In existing solutions, such as lighting controllers, a manufacturer needs to deploy a physical gateway or other interface to support their proprietary connectivity requirements. Through the virtualized grid they can simply provide a lightweight software service that translates their control criteria to the virtualized controller.

In addition to a remote vendor 210, the external network 206 may also provide access for remote or mobile users 208 such that they can connect to the building virtual grid through their mobile device. Local access may also be granted to a local user/engineer workstation 212. This may correspond to an administrative workstation and/or individual control devices in various locations throughout the building. For example, touchscreen panels may be provided in each office to provide local control of HVAC temperature, ventilation airflow, lighting, security systems, and so forth. A firewall device 214 may also be provided to grant access to less secure devices that may connect with the system through the BAN 104.

In some embodiments, the advantages inherent in the virtualization layer 202 may be particularly pronounced when new resources or physical assets and to the system. For example, some embodiments may include users with electric vehicles who want to swap batteries or fuel cells from the vehicle with an energy system in their office building. Previously, the operating characteristics of the batteries or fuel cells would need to be known when the system was designed in order to handle such a transfer between the electric vehicle and the building. In these embodiments, the virtualization layer 202 can detect a new fuel cell or battery module inserted into a receptacle, interrogate/authenticate the battery module to receive profile information, determine the operating characteristics of the battery module or fuel cell from the profile information, and integrate the operation of the battery module or fuel cell into the smart grid. Depending on the energy level of the battery module or fuel-cell, the virtualization layer 202 can classify it as an energy consuming device or an energy providing device. As an energy consuming device, the smart grid can charge or refuel the battery module or fuel-cell, and as an energy providing device, the virtualization layer 202 can cause the receptacle to extract energy from the battery module or fuel-cell for use in other resources throughout the building. The ability to assess, authenticate, integrate, report, etc., on devices that are dynamically added or removed into the smart grid ecosystem can be accomplished without a priori knowledge of how those devices operate. In essence, the interface both logically and physically is standardized between individual resources in the ecosystem and the virtualization layer 202 and physical interface gateway 204.

The virtualization grid abstracts the physical from the logical representations of devices on the system. This allows for dynamic resource integration, monitoring, and management. Instead of running virtual machines, the virtualization layer can run virtual devices representing energy devices. Additionally, the virtualization layer can run user interfaces or containers to support vendor services or support utility integration. Another difference between traditional hardware virtualization in the IT world and the energy virtualization layer of the grid described herein is distribution. Traditional virtualization is done on a single physical system. In contrast, the virtualization layer can be distributed across many different devices since the system uses the IP network to interconnect these remote devices.

Figure 3:
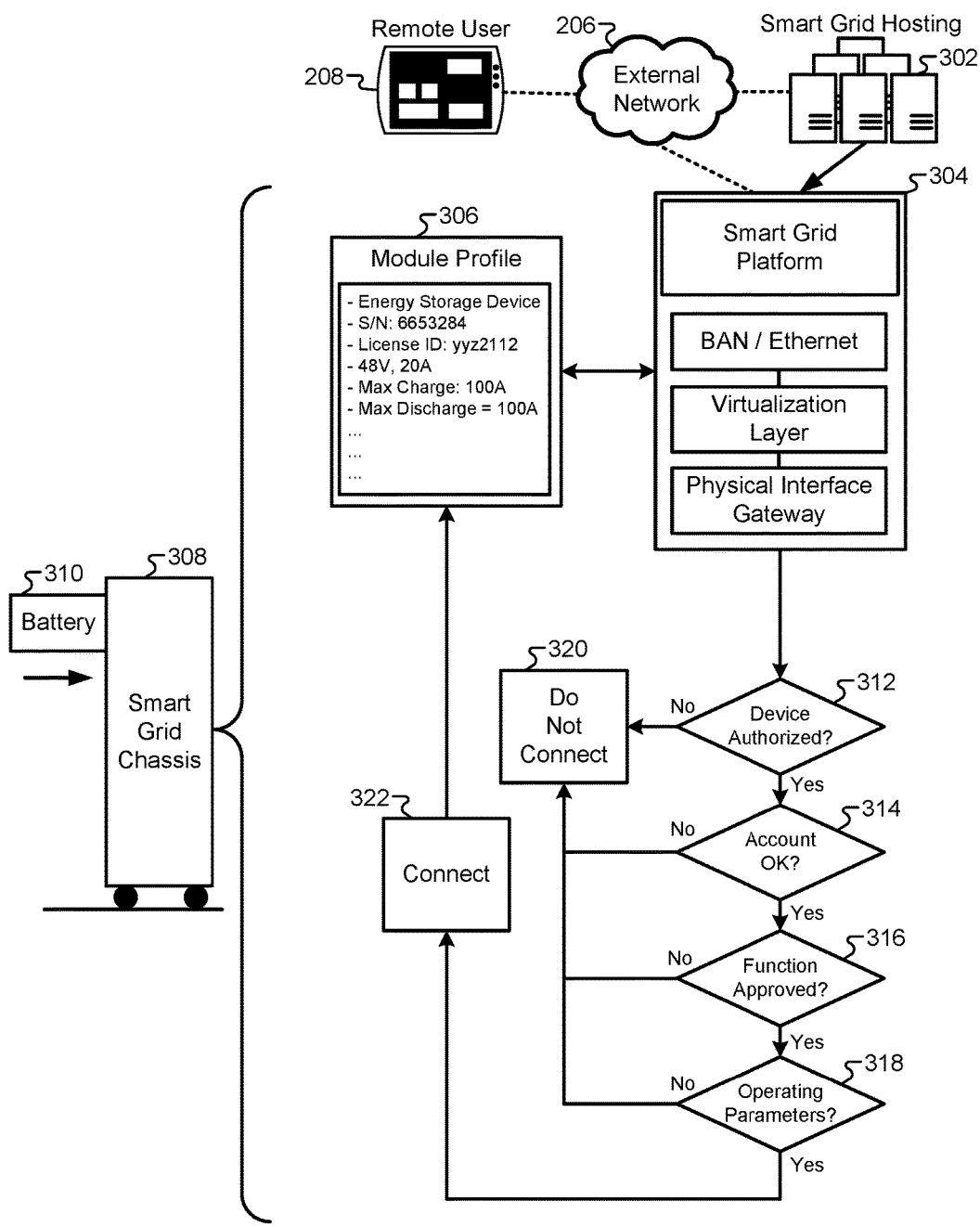
FIG. 3 illustrates a system for authenticating devices, according to some embodiments.

FIG. 3 illustrates a system for authenticating devices, according to some embodiments. As used herein the term "authenticating" refers to a process of receiving an indication that a new device is connected to the smart grid system, sending an interrogation to the new device, receiving information that indicates whether the new device is compatible with the virtualized grid system, and receiving a module profile that informs the smart grid system how to interact with the new device. In this example, one of the power consuming/producing devices may include a virtual grid chassis 308, and the new device may include a modular battery 310 that is being inserted into the smart grid chassis 308. The virtual grid platform 304 may include the network, virtualization layer and the physical interface gateway described above. When a new device is detected by the system, the virtual grid platform 304 can automatically interrogate, authorize, and begin functioning with the new device. In some embodiments, the remote user 208 and/or a cloud-based virtual grid hosting service 302 can also initialize the authentication process. In some embodiments, the virtual grid hosting service 302 can communicate directly with the virtual grid platform 304, while in other embodiments such communication may be facilitated through an external network 206.

Once a new device is detected, a determination can be made whether the device is authorized to work with the virtual grid platform 304 (312). This determination can be made by examining one or more of the operating characteristics in the module profile described below in determining whether the operating characteristics are compatible with the virtual grid platform 304. In some embodiments, this determination can be made by reading a serial number or other identifier from the new device and comparing the serial number to a list of compatible devices either stored locally on the smart grid platform 304 or remotely at the virtualized grid hosting service 302. Some embodiments may use a cryptographic authentication process whereby cryptographic keys are used to authenticate (in a cryptographic sense) the identity of the new device by providing an authenticating digital signatures. For example, public/private key pairs may be used on both the virtual grid platform 304 and the new device to authenticate the identity of the new device. If the device is not authorized, the virtual grid platform 304 can disable be physical connection between the new device and the virtual grid chassis 308 (320).

If the device is authorized, the virtual grid platform 304 can then determine whether a user account associated with the virtual grid platform 304 may allow the new device to be integrated with the virtual grid platform 304. In some embodiments, a determination can be made whether the user account is in good standing with the virtual grid hosting system 302. Some embodiments may use a subscription-based service, where the virtual grid platform 304 is provided as an Energy as a Service (EaaS) platform. Under an EaaS user account, the hardware/software for the virtual grid platform 304 can be installed at the building, but ownership of the hardware/software may remain with the smart grid company. Instead of purchasing the equipment/software, the user may instead subscribe to a service that allows them to reactivate their account on a periodic basis, such as monthly. A determination as to whether the account permits a new device to be added may include ensuring that the user account is currently active and in good standing. In other embodiments, the smart grid hardware/software may be purchased by the building owner/manager. In this case, the user may set up permissions and controls that determine whether certain brands of devices or types of devices are allowed on the network. Therefore, even though a device may be authorized, the user account itself may prohibit such a device from being activated on the smart grid platform 304. If the user account is not determined to allow the device to be connected, the connection can be disallowed as described above (320).

If the account is approved for the new device, the virtual grid platform 304 can determine whether the function performed by the device is approved (316). As described below, each device may perform a specific function, such as an HVAC function, a temperature control function, a lighting function, a door lock function, and so forth. Some device functions may be incompatible with the building structure and may thus be disallowed. For example, a security system controller may not be compatible with a building that does not include security system sensors. If the function is not allowed, then the connection to the new device may be interrupted as described above (320).

In some embodiments, the virtual grid platform 304 may request a set of operating parameters and/or characteristics from the new device (318). The operating parameters/characteristics may be stored in a module profile 306 that is transmitted from the new device to the virtual grid platform 304 as part of the authentication process. Alternatively or additionally, the new device may send some identifying information to the virtual grid platform 304, and the virtual grid platform 304 can look up the module profile 306 in a local database or online through the virtual grid hosting service 302. If parameters are provided and they are compatible with the virtual grid platform 304, the device can be connected to the virtual grid platform 304 (322).

The operating parameters/characteristics in the module profile 306 may include a wide variety of information. In the example of FIG. 3, the module profile 306 includes a category of device classifying new device as an energy storage device (as opposed to an energy consuming device or energy control device). The module profile 306 may also include a serial number and/or other identifying information, such as a manufacturer, a part number, a series number, and so forth. The module profile 306 may also include digital rights information, such as a software license or encryption keys that allow the software required to interact with the new device to be downloaded and/or used by the virtual grid platform 304. In the case of energy consuming/producing devices, the module profile 306 may include electrical operating parameters, such as a voltage provided/required, a current provided/required, a battery chemistry, a fuel cell type, a maximum number of charge cycles, a history of charge cycles, a storage capacity, a charge level, a maximum number of charge cycles, waveform timing characteristics, minimum/maximum error ranges, operating temperature ranges, cooling requirements, flowable waste/electrolyte requirements, and so forth. This information may be required by the virtual grid platform 304 in order to properly extract energy from the new device and/or provide energy to the device. Note that some devices, such as the battery 310 in FIG. 3, may be classified as both an energy storage device and/or energy consuming device. When the battery 310 has sufficient charge, the battery 310 the be used as an energy providing device to provide energy to the virtual grid platform 304 for use with other energy consuming devices. Alternatively, when the battery 310 does not have sufficient charge (e.g., below a threshold amount), the battery 310 can be used as an energy consuming device, and may be charged by energy received from the virtual grid platform 304.

In some embodiments, the module profile 306 provides the virtual grid platform 304 with all the information necessary to interact with the new device in a plug-and-play fashion. This allows new devices to be developed without requiring a software upgrade to the virtualization layer of the virtual grid platform. Instead, the virtualization layer treats every new device as a virtual resource, part of a dynamic resource pool, and relies on the virtual resource to provide information necessary for its integration into the rest of the virtual grid ecosystem. The module profile 306 in FIG. 3 is specific to an energy storage/providing device. In cases where the new device is an energy consuming device, the module profile 306 may include AC/DC current, voltage, and/or waveform requirements to power the device, along with communication protocols and/or recognized commands that can be provided to/from the new device. An energy control device may have a module profile that includes similar information for powering the energy control device, along with commands and/or communication protocols that may be transmitted to/from the energy control device.

Figure 4A:
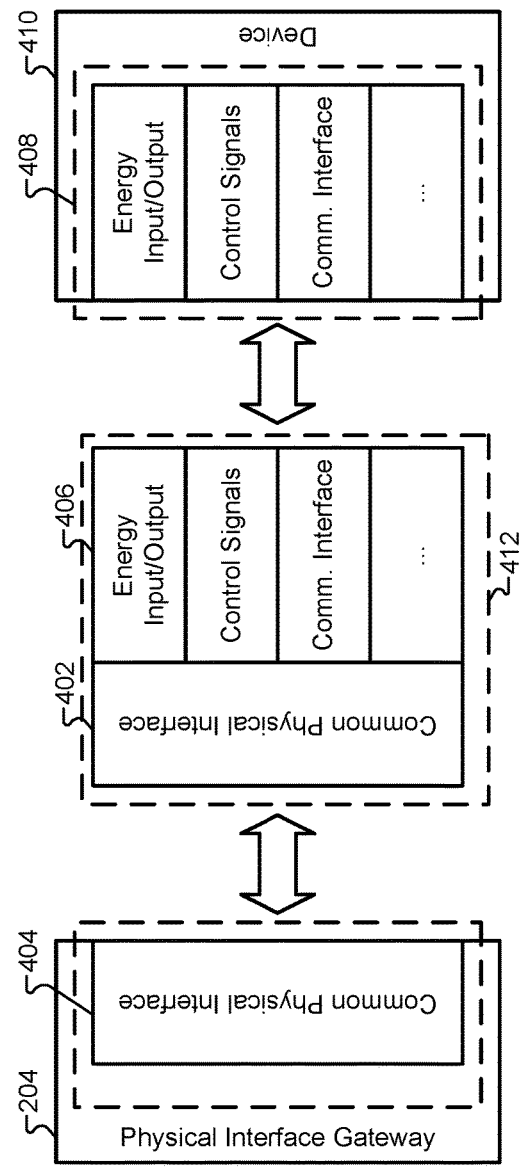
FIG. 4A illustrates a common interface and adapter for the physical interface gateway, according to some embodiments.

FIG. 4A illustrates a common interface and adapter for the physical interface gateway, according to some embodiments. The module profile described in relation to FIG. 3 allows the virtualization layer to interact with any device by treating it as a virtualized resource. The physical interface gateway 204 of the virtual grid platform provides a standardized physical interface for any of the energy consuming/producing/control devices that may be physically attached to the virtual grid system. The embodiment of FIG. 4A includes an adapter 412 that can be inserted between the physical interface gateway 204 and the device 410. The physical interface gateway 204 may include a common physical interface 404 that can accommodate nearly any energy consuming/producing/control device. The common physical interface 404 may include an AC power connection, a DC power connection, a communication bus interface, and/or one or more digital I/O signals. An example of this interface will be described in greater detail below in relation to FIG. 10. The AC/DC power connections can provide power to or retrieve power from the device 410. Alternatively Power over Ethernet (PoE) may be used to provide communications to/from the controller electronics along with the power necessary to operate them. The communication bus interface can send/receive commands to/from the device 410, including status information profile information, and function actuation commands. The one or more digital I/O signals can include reset signals, enable signals, and other status commands/signals.

When interfacing with the device 410, many devices may not be initially compatible with the common physical interface 404 of the virtual grid platform. For example, the device 410 may include a proprietary interface 408 that includes its own energy input/outputs, control signals, communication interface, and so forth. The proprietary interface 408 may or may not be compatible with the common physical interface 404. Therefore, the hardware adapter 412 may be coupled physically between the device 410 and the physical interface gateway 204, acting as both a physical and logical adapter. The adapter 412 may include a first interface 406 that is compatible with the proprietary interface 408 of the device 410. Thus, each specific device 410 that is not inherently compatible with the common physical interface 404 may use its own unique adapter with a first interface 406 that is compatible with the device 410. The adapter 412 may additionally include circuitry that translates the signals received from the device 410 into signals that are compatible with the common physical interface 404. The circuitry may include bus interface/translation integrated circuits (ICs), voltage-level-shifting circuits, modulation and/or delay circuits, and so forth. The first interface 404 may also include physical connectors that matching the physical interface of the device 410.

Although the adapter 412 for each device 410 may include a unique first interface 406, a second interface 402 may be uniform across each adapter 412. The second interface 402 may include an interface that is both physically and logically compatible with the common physical interface 404 of the physical interface gateway 204. Therefore, by inserting the adapter 412 between the device 410 and the physical interface gateway 404, the device 410 will transparently appear to the physical interface gateway 204 as though it has an interface inherently that is compatible with the common physical interface 404. Similarly, it will appear to the device 410 as though it is interfacing with a compatible device with the first interface 406 rather than with the physical interface gateway 204. This allows existing legacy devices to be integrated seamlessly into the virtual grid platform and can interface with the virtualization layer without requiring software/hardware upgrades to either device or platform.

Figure 4B:
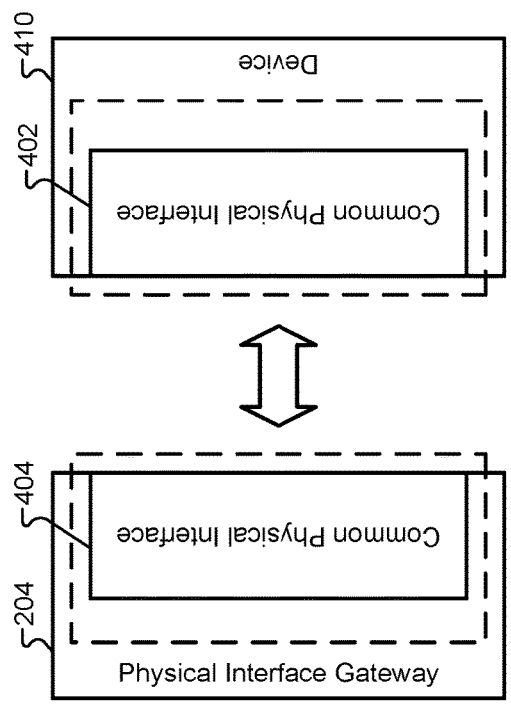
FIG. 4B illustrates a device that is equipped with a common physical interface, according to some embodiments.

FIG. 4B illustrates a device 410 that is equipped with a common physical interface 402, according to some embodiments. As the common physical interface 404 of the virtual grid system becomes standardized and more widely used, more devices may come equipped inherently with a common physical interface 402 rather than one of the many proprietary interfaces. In this case, the adapter can be removed from the connection between the physical interface gateway 204 and the device 410.

Figure 5:
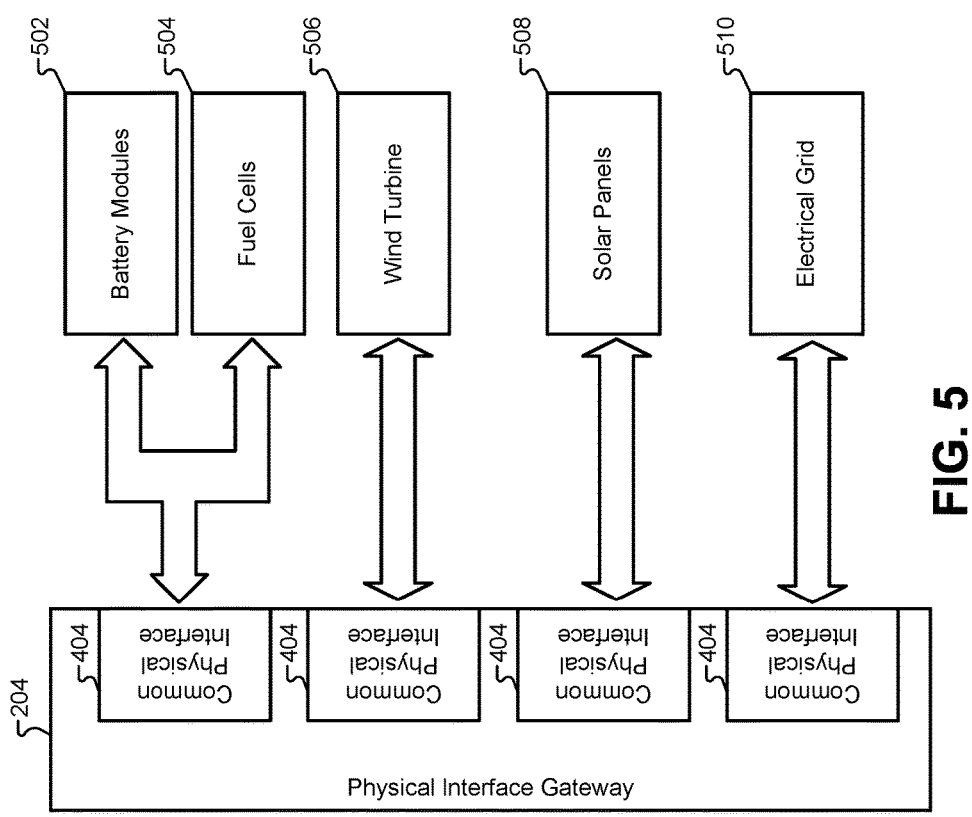
FIG. 5 illustrates a plurality of energy producing devices coupled to the physical interface gateway, according to some embodiments.

FIG. 5 illustrates a plurality of energy producing devices coupled to the physical interface gateway 204, according to some embodiments. Each of the plurality of energy producing devices may be coupled to unique instance of the common physical interface 404. The specific energy producing devices depicted in FIG. 5 are merely examples and are not meant to be limiting. In some embodiments, the electrical power grid 510 that provides commercial electrical power to the building can be coupled to the physical interface gateway 204. The electrical grid 510 may be connected through a traditional electrical box that is then modified to include a connection to the virtualization layer described above.

In addition to the electrical power grid 510, some embodiments may also include local energy generation and/or storage. For example, a residential or commercial building may include solar panels 508 that generate electricity specifically for the particular building. The solar panels 508 may provide electrical power to the physical interface gateway 204. Similarly, some installations may include other energy producing devices, such as a wind turbine 506, hydroelectric power generation, and so forth. In these cases, excess energy may be provided by these local energy generation devices such that the electrical grid 510 can also be classified as an energy consuming device. In other words, electricity generated and/or stored by the local energy producing devices can be used to provide power to the electrical grid 510. The virtualization layer can track an amount of energy provided to the electrical grid 510, as the user may be eligible for rebates, incentives, or payments from an electrical utility provider.

Some embodiments may include a chassis that allows for the insertion of battery modules 502 and/or fuel cells 504. Like the electrical grid 510, the battery modules 502 and/or fuel cells 504 may be classified as both energy producing devices as well as energy consuming devices depending on whether the physical interface gateway 204 provides electrical power and/or fuel to charge the battery modules 502 and/or fuel cells 504, or whether the physical interface gateway 204 receives electrical power from the battery modules 502 and/or fuel cells 504.

Figure 6:
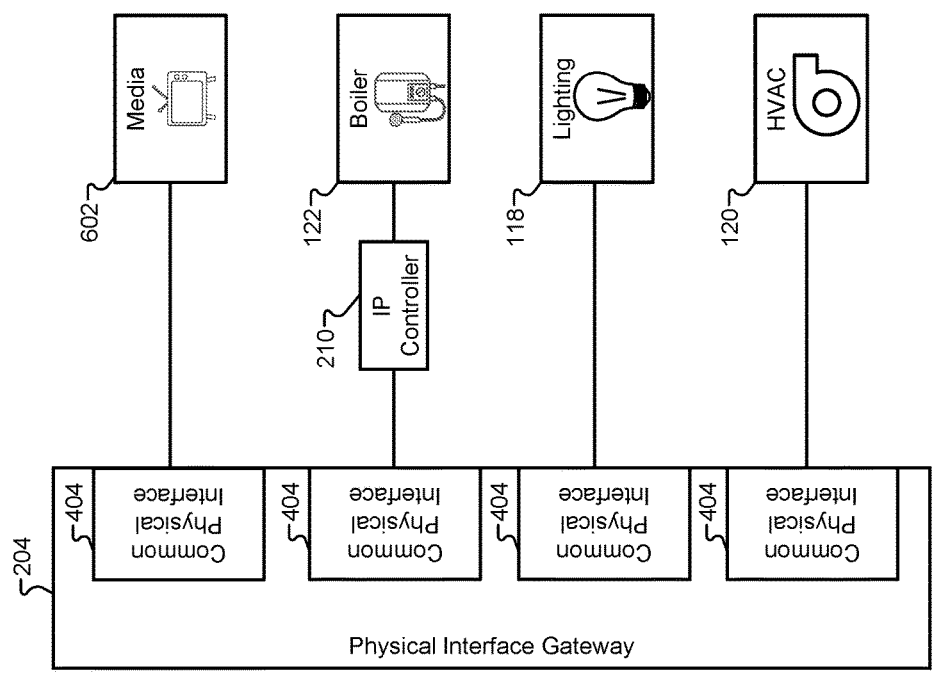
FIG. 6 illustrates a plurality of energy consuming devices coupled to the physical interface gateway according to some embodiments.

FIG. 6 illustrates a plurality of energy consuming devices coupled to the physical interface gateway 204 according to some embodiments. As described above for the energy producing devices of FIG. 5, the energy consuming devices may each be coupled to a unique instance a common physical interface 404. Energy consuming devices may include an HVAC system 120, a lighting system 118, a boiler system 122, a water heater, any number of smart appliances, and so forth. Some devices that may be classified as control devices may also be classified as energy consuming devices, such as environmental sensors, a security system, a thermostat, and so forth.

As described above in relation to FIG. 2, the physical interface of each device may include an IP module that allows direct communication between devices and between devices in the virtualization layer over the BAN in the smart grid platform. The IP controller may be associated with an IP address that allows devices to address other devices using their IP addresses. One such example in FIG. 6 is the boiler device 122, which can communicate via an IP controller 210.

Figure 7:
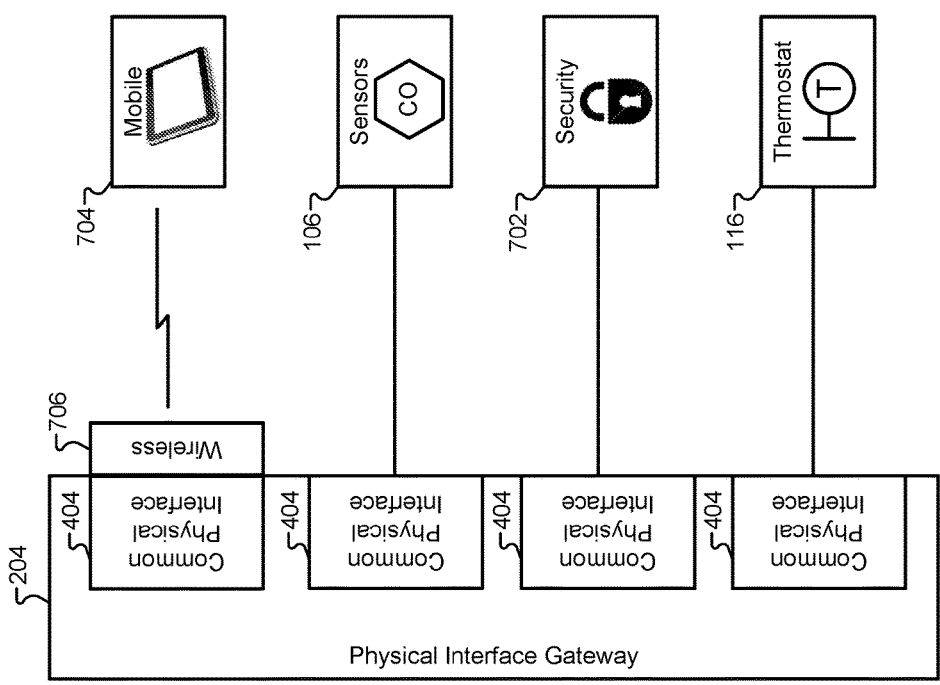
FIG. 7 illustrates a plurality of energy control devices, according to some embodiments.

FIG. 7 illustrates a plurality of energy control devices, according to some embodiments. Note that many of the energy control devices depicted in FIG. 7 may also qualify as energy consuming devices. These energy control devices may include a thermostat 116, a security system 702, carbon monoxide sensors 106, hazard detectors, smoke detectors, and so forth. Additionally, a control device may include one or more mobile computing devices 704. Mobile computing devices 704 may communicate wirelessly with the virtual grid platform. To facilitate wireless communications, a wireless adapter 706 may be connected to one of the common physical interfaces 404. Alternatively, some embodiments of the physical interface gateway 204 may include a dedicated wireless communication port that is compatible with common wireless communication standards, such as IEEE 802.11, Bluetooth, ZigBee, Thread, and so forth.

Figure 8:
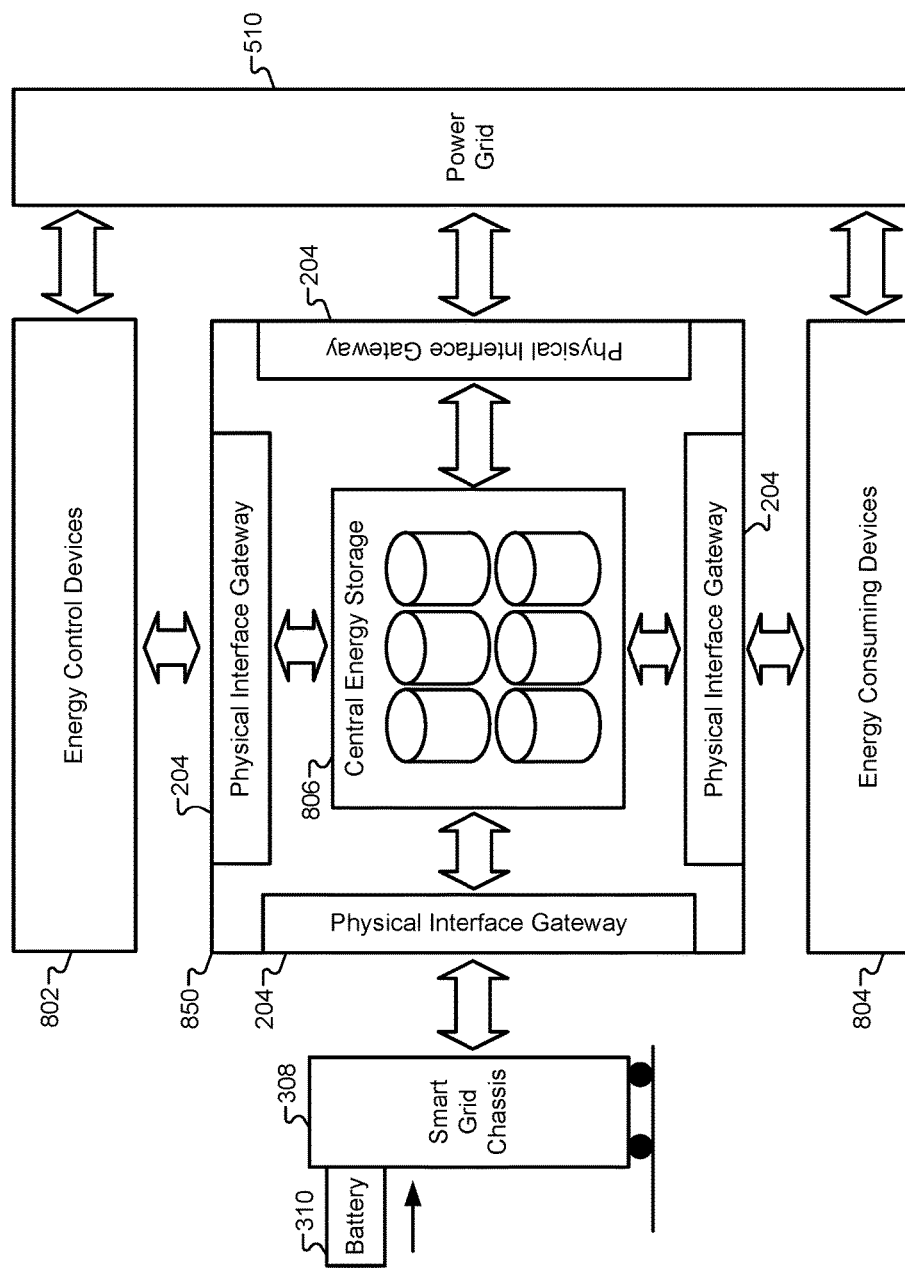
FIG. 8 illustrates a block diagram of a system for storing and managing energy through the smart grid platform, according to some embodiments.

FIG. 8 illustrates a block diagram of a system for storing and managing energy through the virtual grid platform 850, according to some embodiments. The virtual grid platform 850 may include connections to a number of devices through the physical interface gateway 204. Each of these devices may provide energy to the virtual grid platform 850. The virtual grid platform 850 may also include a central energy storage device 806, which may be comprised of super capacitors, battery chemistries, battery cells, fuel cells, and/ or the like. Energy received through the physical interface gateway 204 can be managed by the virtualization layer and stored in the central energy storage device 806. Similarly, when energy consuming devices require energy from the virtual grid platform 850, the virtualization layer can cause the central energy storage device 806 to provide energy through the physical interface gateway 204 to the requesting energy consuming device.

By way of example, the virtual grid chassis 308 that includes one or more battery modules 310 can provide energy to the central energy storage 806. Similarly, other energy producing devices, such as solar panels, wind turbines, hydroelectric power, geothermal power, and so forth, may also provide energy through the physical interface gateway 204 to be stored in the central energy storage device 806. The power grid 510 may also store and/or receive energy from the central energy storage, based on whether the energy virtualization layer determines that sufficient excess energy is no longer needed by the building and can instead be provided to the power grid 510. The central energy storage 806 provides a way for energy to be aggregated from various sources and distributed to various energy consuming devices in a real-time system.

In FIG. 8, energy received from the power grid 510 may be routed through the virtual grid platform 850 before it is delivered to various energy consuming devices 804 and/or various energy control devices 802. In some embodiments, the power grid 510 may also be directly connected to the energy consuming devices 804 and/or energy control devices 802, and the energy consumption of such devices may be governed by the virtualization layer of the virtual grid platform 850. For example, an energy consuming device, such as a television, may be connected to a traditional 110 V outlet in a user's home. Energy may be provided directly from the power grid 510 to the television, but the energy usage of the television may be monitored through the physical interface gateway 204 by the virtualization layer. This allows the virtualization layer to institute household energy budgets and regulate the use of energy by various energy consuming devices 804 even when it does not directly provide power to such devices.

Figure 9:
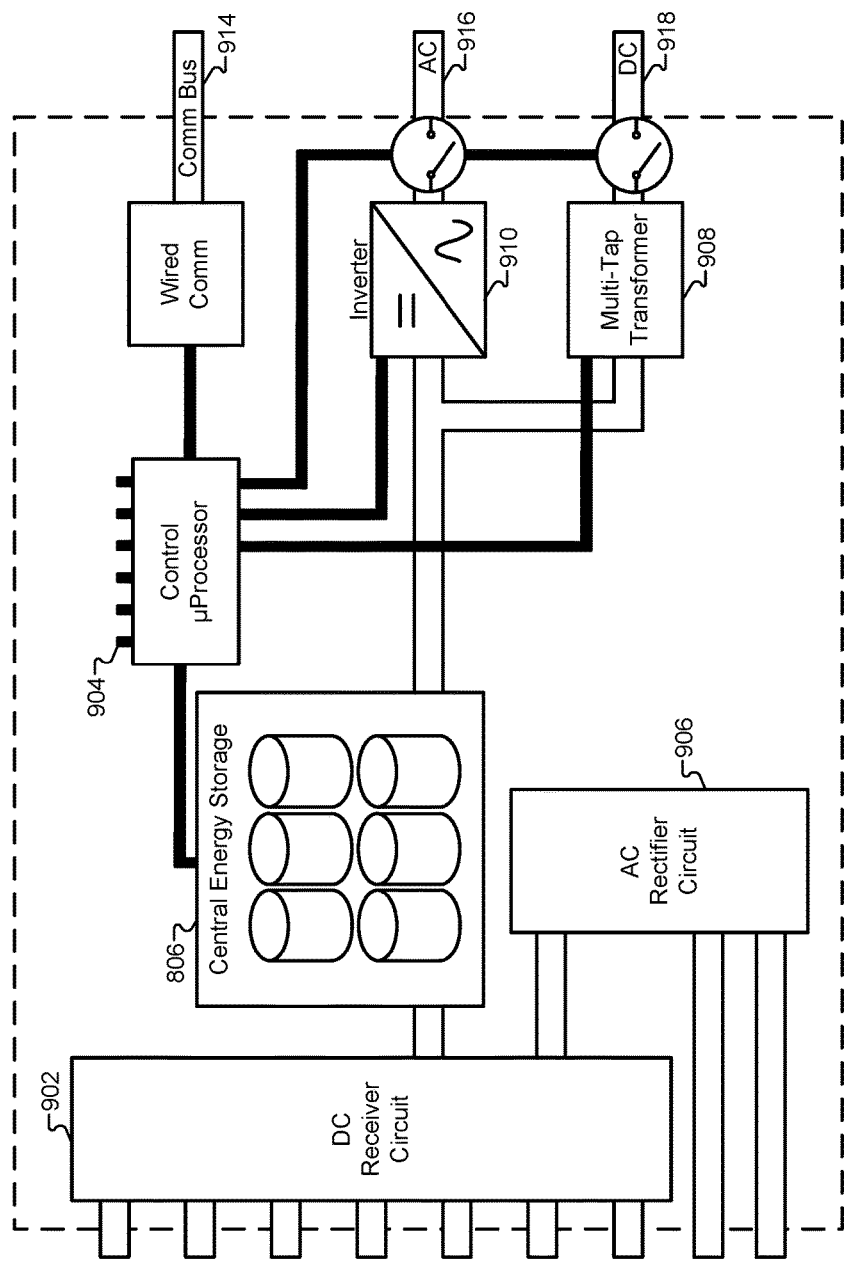
FIG. 9 illustrates a simplified circuit diagram that may be found on the smart building virtualization platform for aggregating and providing energy of various forms throughout the system, according to some embodiments.

FIG. 9 illustrates a simplified circuit diagram that may be found on the virtual grid platform for aggregating and providing energy of various forms throughout the system, according to some embodiments. The circuit may include a DC receiver circuit 902 that receives DC voltages/currents from various sources, such as fuel cells, battery modules, solar panels, and so forth. The DC receiver circuit 902 can receive these various DC signals and convert them into a single DC signal to charge the central energy storage device 806. Similarly, the circuit may include an AC rectifier circuit 906 that can receive and rectify AC signals from sources such as the electric power grid. The DC rectifier circuit 906 can combine these regulated DC circuits and provide them to the central energy storage device 806 for storage. Some embodiments may direct the rectified DC signal from the AC rectifier circuit 906 to the DC receiver circuit as simply another DC input to be aggregated.

A control processor 904 can monitor the central energy storage 806 and control various outputs. The energy virtualization layer may operate on the control processor 904. Although the virtual grid platform may include numerous AC and DC outputs, only a single pair of outputs is depicted in FIG. 9 for the sake of clarity. The virtualization layer operating on the control processor 904 can provide signals to an inverter 910 and a multi-tap transformer 908 to provide various AC signals 916 and DC signals 918, respectively.

The control processor can govern the current, voltage, and/or frequency of each output signal based on the energy consuming device that is coupled to the outputs 916 and/or 918. Recall above how the virtualization layer may receive a module profile for each energy consuming device. The profile information may include, for example, a DC voltage and current that is required by the energy consuming device. When connected to the outputs 916 and/or 918, the virtualization layer can, for example, turn off the inverter 910 and program the multi-tap transformer 908 to provide the specified DC voltage and current. As described above, the physical interface may also include a communication bus 914 that is either shared between various devices in the system and addressed using an IP protocol, or is alternatively dedicated to the specific device connected to this particular interface.

Figure 10:
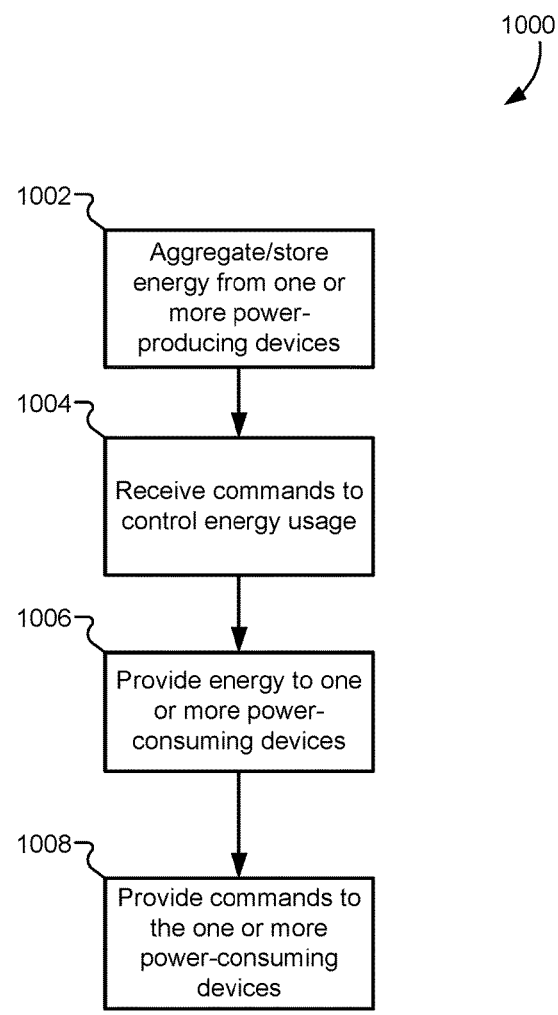
FIG. 10 illustrates a flowchart of a method for using a smart grid platform to manage energy usage in a building.

FIG. 10 illustrates a flowchart of a method for using a smart grid platform to manage energy usage in a building. The method may include aggregating/storing energy from one or more energy-producing devices (1002). The method may also include receiving commands to control energy usage (1004). These commands may be received from energy control devices through a virtualization layer as described above. Additionally, these commands may be generated by the energy virtualization layer itself according to an energy usage plan, budget, or schedule. The method may also include providing energy to one or more energy consuming devices (1006). Energy may be provided through a standardized physical interface as described above. The method may further include providing commands to the one or more energy consuming devices (1008). These commands may be provided to govern the usage of these energy consuming devices while they are receiving energy from the virtual grid platform.

It should be appreciated that the specific steps illustrated in FIG. 10 provide particular methods of using a smart grid platform to manage energy usage according to various embodiments. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Weather inputs may be received from external services, and the virtual grid may use these weather inputs to react or preempt conditions by, for example, pre-heating/-cooling the building. One of ordinary skill in the art would recognize many variations, modifications, and alternatives.

The technical advantages and technology problem solved by the energy virtualization layer and virtual grid platform described above should be readily apparent in light of this disclosure. Virtualization is a concept that is familiar in the realm of computer systems and computer networks, particularly in information technology (IT). The virtualization of computer resources allows for cloud services, large-scale operating environments, dynamic user experiences, and cost-effectiveness. In that same vein, energy virtualization as described herein logically defines all energy elements, including generation, storage, consumer usage, etc. three sophisticated—yet simple—management platform, energy virtualization allows for the dynamic allocation of energy resources based on demand, availability, time of use, and a variety of other factors. Energy virtualization overcomes many of the challenges currently facing in the smart home and smart building concepts. It also provides a means for users and utilities to plan, customize, and streamline the delivery and access to various energy services.

Specifically, energy virtualization provides an infrastructure at a macro and micro level that provides a flexible, scalable energy system. In its simplest form, energy virtualization of boys the direct communication of energy control devices to the energy consuming devices for example, energy virtualization does not require the direct connection of the thermostat to an HVAC management system. Instead, each device, regardless of whether it is an energy control device or an energy consuming device, can be coupled to a virtualization layer, or "energy hypervisor" that can dynamically receive commands from control devices and provide commands to energy consuming devices as required. Additionally, energy sources, such as SEC's, traditional power outlets, solar panels, fuel cells, and so forth, are simply additional inputs to the virtualization layer that can be paired with other devices as needed. This avoids the use of proprietary gateways, and single points of failure. Additionally, it provides innate security measures to properly control who and what has access to various resources, and the extent of their control and interaction. Thorough monitoring and logging of events can also be realized.

For example, energy virtualization does not require a fixed relationship between different layers (e.g., power, control, and consumption). While the problems arising with a fixed-relationship approach may not always be overly apparent in a residential context, they come to the forefront in a commercial context. A Building Management System (BMS) is able to create a monopoly on the systems within a commercial building. This forces tenants to adopt those systems for their use, and the tenants are often limited by the functionality and lack of interoperability with the available energy management products that tenants might otherwise wish to use. Traditional BMS vendors are notoriously slow to embrace new technologies as they are released, and are often reluctant to integrate their existing systems with new technologies for business reasons. Even if the commercial building management wanted to purchase a new BMS, this would require a large capital expenditure in order to be compatible with emerging technologies. Energy virtualization solve these and many other problems by allowing a "plug-and-play" ability to run BMS' in parallel and dynamically add/subtract new systems and components as they become available/deprecated.

Energy virtualization also improves energy security. Specifically, the energy virtualization system described herein can create a more secure environment for landlords, tenants, utilities, systems, and other entities operating with in the context of the energy virtualization system. When it comes to Demand Side Management (DSM) and other control and system management techniques, it may in some cases be crucial to quickly adopt, and have greater control of, sustainable energy. Currently, in the consumer, residential and commercial spaces, interoperability amongst Smart Home or BMSs is impossible. BMS systems typically provide simple generic management and automation capabilities. Energy virtualization will allow energy system manufacturers to run optimization and continuous commissioning processes alongside the BMS/BAS systems to ensure all systems are running at maximum efficiency.

The increased levels of availability and flexibility provided by energy virtualization ensure that assets can always be monitored and controlled, even during abnormal conditions. The embodiments described herein simplify how disparate systems can be quickly integrated, including HVAC systems, electrical systems, emergency systems, fire alarms, smart home systems, and so forth. Each of these systems is "virtualized" to become simply another components running on the energy virtualization platform and using a standardized means for connecting to other devices and energy sources. For example, a virtualized platform can simplify how emergency services and other third parties may be granted access during abnormal events. Evolving codes and safety standards can be downloaded through software patches or electronic upgrades to individual components rather than requiring a complete system replacement. In addition to energy security, authentication is becoming increasingly important to energy facilities and transmission systems. A virtualized energy solution described herein is the simplest and most robust way to accommodate energy authentication to assess the identity and interoperability of each system connected to the energy virtualization layer.

Energy virtualization allows virtually any component to be connected to a smart home system. It abstracts the myriad of "Internet of Things" (IoT) sensors and components, and thus allow them to be used with freedom rather than being locked into a single gateway solution. Besides being able to communicate and interoperate freely with other devices, the virtualization platform described herein is also a centralized source of reliable AC and DC power (e.g., 48V DC) and communication interfaces. Therefore, the virtualization layer is also effectively a large Power over Internet (PoE) source for sensors, controllers, lighting systems, automation systems, smart appliances, and so forth. The virtualization layer allows cloud services and IoT devices to manage systems locally or via a smart device. It also allows for the integration of data from third parties, such as real-time pricing models, feedback on utilization, time-of-use, demand response pricing, and so forth.

The energy virtualization model may be coupled with the portable energy system described in detail above that includes modular batteries and/or fuel cell technologies. In other examples, an energy virtualization model can be coupled with distributed energy systems, micro-/nano-grids, personalized service delivery systems, and various other systems emerging in the energy sector. In such examples, energy virtualization provides a toolkit that allows a previously static local energy system to have much greater flexibility and scalability. As energy virtualization becomes more widely used, it enables standardization and modularity across energy systems, which in turns makes compatible devices and systems simpler to design, install, manage, and/or scale, and to do so securely. For example, a virtualized energy system can be quickly rolled back in the case of a failure, malicious attack, code corruption, and so forth. Updates and patches can be distributed and/or installed remotely or locally via secure means.

In some embodiments, energy virtualization supports not only the delivery of energy to various systems and/or devices, but it can incorporate other value-added services, such as communication channels and systems, security systems, entertainment systems, content delivery, and so forth as part of a hyper-converged energy system economy. Some embodiments may also include a portal that allows access to individual tenants in an energy system without requiring either party to provide administrator access. Third parties that are granted access can be selectively allowed to access monitoring data, usage data, usage trends, and so forth. Energy virtualization also enables the ability to dynamically manage a wide variety of resources to effectively respond to a wide variety of situations and demand scenarios, such as weather outages or demand charges.

Some embodiments may be integrated with a cloud service to store historical usage data and shard data. A cloud component may also be used for remotely managing and/or monitoring data and energy usage. Some embodiments may also include access to a private cloud such that private data need not leave the owner's site. Connections to cloud or other networked infrastructures may include a standardized means of deploying infrastructure on servers and common IT hardware (as opposed to proprietary systems).

In some embodiments, individual energy virtualization systems can be interconnected through a power/communication grid. From the macro view, each virtualization system may be viewed as a scalable resource. As systems grow, new tenants can move in to existing energy virtualization system, migrate between systems, or expand to other sites. A virtual grid management server can manage a common energy profile that can be federated across sites for a consistent corporate policy. As a service provider (or "virtual utility"), virtualization allows widespread aggregation and management of resources to roll up capacity, minimize impact to grid, maximize potential benefits to grid plus customers. This simplifies a means to integrate real-time pricing mechanisms and disseminate across a large pool of resources using standardized and adaptable techniques. Furthermore, changes to capabilities, new initiatives, manufacturer upgrades, government mandates, etc. can all be remotely deployed, monitored and enforced if necessary.

Energy virtualization simplifies and enables the process of dynamically installing, allocating, or leveraging resources as they range from generation to storage or otherwise. For hyper-converged systems, energy virtualization can further enable the transition from one form of energy to another. For example, in an electric vehicle, the same basic infrastructure can integrate and support energy storage modules, as well as accommodate a change to fuel-cell modules for the advantages that they may offer. Thus, vehicles and other resources are not locked into a fixed energy source, but can rather be supplied by any standards-based virtual resource.

As described above, resources in the smart grid platform can communicate in parallel with each other. Embodiments include using IP-based, serial, 2-wire, and/or other traditional means of connecting sensors (temp, light, CO, etc.), controllers (HVAC actuators, fans, etc.), and/or energy systems (lighting, furnace, air handler, etc.). These can be aggregated into a neutral interface gateway. Each energy component and interface may be digitized, categorized and defined in software logic as to its purpose, making it an icon (block, unit, or resource) that can be dragged into configurations that minimize repetitive programming and configuration like a traditional virtual resource. The common physical interface abstracts the myriad of devices that may be involved, from the software and management layers required to neutrally host a variety of users and third-parties. Each resource may have a profile that can be manually created or configured, or provided by a manufacturer, that may be automatically recognized by the virtualization layer when connected.

The virtual grid platform may include a traditional server-storage platform that may run proprietary software to provide an open interface to allow users interact with the BMS, vendor tools, utilities, sensors, and other components. It allows third-party systems and controllers to communicate across a standardized protocol, such as IP, to provide common access to resources. Rather than deploying workstations and other systems for each vendor's product, their functionality can be aggregated into the common system of the smart grid platform described above.

Rather than using a high voltage supply or riser that is common in most buildings, some embodiments may use a native 48V DC source that may be deployed as a high-current DC common backbone, such as the aggregated DC signal in FIG. 10. This may eliminate a series of transformers involved to go from utility voltage 13+kV to 480V, 208V, 110V AV to 12V DC, etc. such that it is consumable by regular electronics which generally wastes a large amount of energy. Instead, 48V DC is common in traditional telecommunications for powering equipment, within the past decade for powering IT system (phones, etc.) over an Ethernet connection, and even a means of powering LED lighting. As part of the riser power solution, and to simplify installation, some embodiments may use superconducting materials, such as REBCO, that allows the high-amperage power riser to be installed in a 2-inch insulated conduit. This may also include a small storage tank and refueling port for maintenance purposes.

Figure 11:
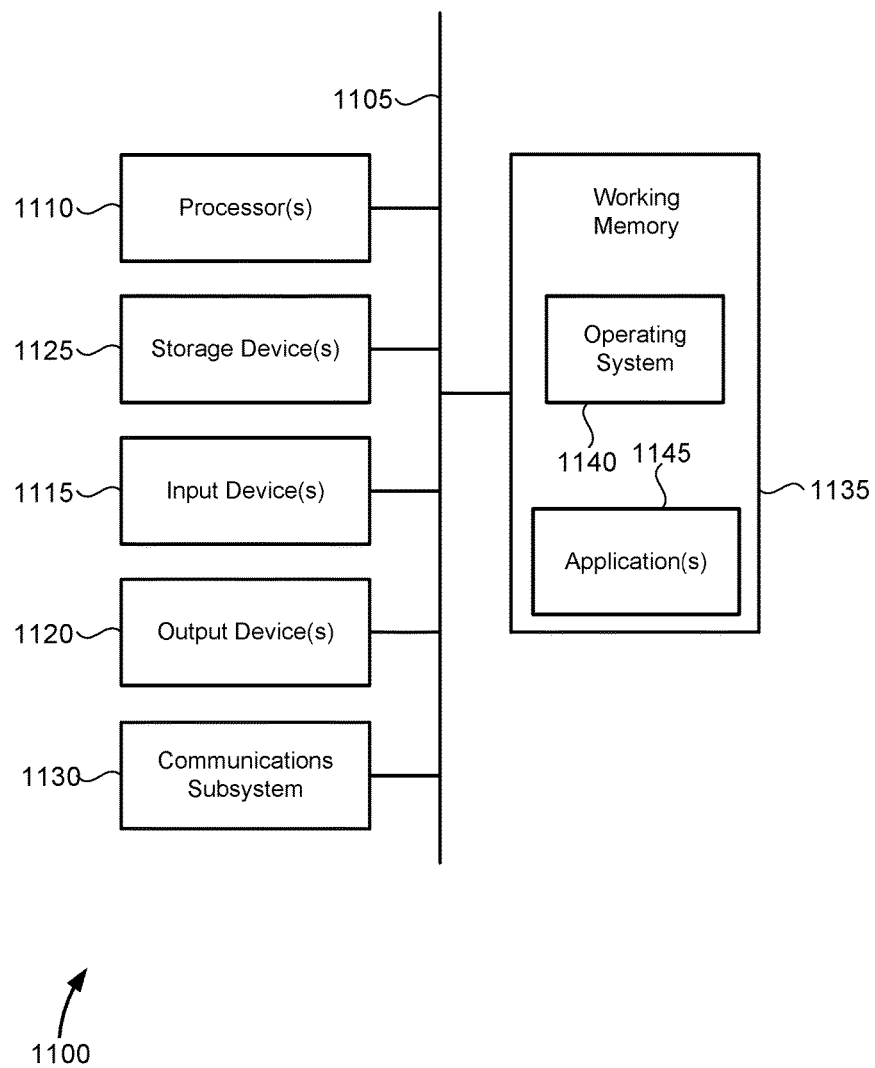
FIG. 11 illustrates a simplified computer system, according to some embodiments.

As described above, the various computer systems in the virtual grid platform, including the computing system that runs the energy virtualization layer, may include specialized server platform. FIG. 11 illustrates a simplified computer system 1100, according to some embodiments. A computer system 1100 as illustrated in FIG. 11 may be incorporated into devices such as a portable electronic device, mobile phone, or other device as described herein. FIG. 11 provides a schematic illustration of one embodiment of a computer system 1100 that can perform some or all of the steps of the methods provided by various embodiments. It should be noted that FIG. 11 is meant only to provide a generalized illustration of various components, any or all of which may be utilized as appropriate. FIG. 11, therefore, broadly illustrates how individual system elements may be implemented in a relatively separated or relatively more integrated manner.

The computer system 1100 is shown comprising hardware elements that can be electrically coupled via a bus 1105, or may otherwise be in communication, as appropriate. The hardware elements may include one or more processors 1110, including without limitation one or more general-purpose processors and/or one or more special-purpose processors such as digital signal processing chips, graphics acceleration processors, and/or the like; one or more input devices 1115, which can include without limitation a mouse, a keyboard, a camera, and/or the like; and one or more output devices 1120, which can include without limitation a display device, a printer, and/or the like.

The computer system 1100 may further include and/or be in communication with one or more non-transitory storage devices 1125, which can comprise, without limitation, local and/or network accessible storage, and/or can include, without limitation, a disk drive, a drive array, an optical storage device, a solid-state storage device, such as a random access memory ("RAM"), and/or a read-only memory ("ROM"), which can be programmable, flash-updateable, and/or the like. Such storage devices may be configured to implement any appropriate data stores, including without limitation, various file systems, database structures, and/or the like.

The computer system 1100 might also include a communications subsystem 1130, which can include without limitation a modem, a network card (wireless or wired), an infrared communication device, a wireless communication device, and/or a chipset such as a Bluetooth™ device, an 802.11 device, a WiFi device, a WiMax device, cellular communication facilities, etc., and/or the like. The communications subsystem 1130 may include one or more input and/or output communication interfaces to permit data to be exchanged with a network such as the network described below to name one example, other computer systems, television, and/or any other devices described herein. Depending on the desired functionality and/or other implementation concerns, a portable electronic device or similar device may communicate image and/or other information via the communications subsystem 1130. In other embodiments, a portable electronic device, e.g. the first electronic device, may be incorporated into the computer system 1100, e.g., an electronic device as an input device 1115. In some embodiments, the computer system 1100 will further comprise a working memory 1135, which can include a RAM or ROM device, as described above.

The computer system 1100 also can include software elements, shown as being currently located within the working memory 1135, including an operating system 1140, device drivers, executable libraries, and/or other code, such as one or more application programs 1145, which may comprise computer programs provided by various embodiments, and/or may be designed to implement methods, and/or configure systems, provided by other embodiments, as described herein. Merely by way of example, one or more procedures described with respect to the methods discussed above, such as those described in relation to FIG. 11, might be implemented as code and/or instructions executable by a computer and/or a processor within a computer; in an aspect, then, such code and/or instructions can be used to configure and/or adapt a general purpose computer or other device to perform one or more operations in accordance with the described methods.

A set of these instructions and/or code may be stored on a non-transitory computer-readable storage medium, such as the storage device(s) 1125 described above. In some cases, the storage medium might be incorporated within a computer system, such as computer system 1100. In other embodiments, the storage medium might be separate from a computer system e.g., a removable medium, such as a compact disc, and/or provided in an installation package, such that the storage medium can be used to program, configure, and/or adapt a general purpose computer with the instructions/code stored thereon. These instructions might take the form of executable code, which is executable by the computer system 1100 and/or might take the form of source and/or installable code, which, upon compilation and/or installation on the computer system 1100 e.g., using any of a variety of generally available compilers, installation programs, compression/decompression utilities, etc., then takes the form of executable code.

It will be apparent to those skilled in the art that substantial variations may be made in accordance with specific requirements. For example, customized hardware might also be used, and/or particular elements might be implemented in hardware, software including portable software, such as applets, etc., or both. Further, connection to other computing devices such as network input/output devices may be employed. The computer systems themselves may be virtualized, following IT industry best practices for security and disaster recovery. This ensures any system compromise can quickly and easily be recovered. One may run containers or headless nano-servers to minimize the exposure or systems running on-site by removing superfluous functionality, with the main user interface and related control facilitated through a hosted or centralized service. Furthermore, these systems may run in parallel to avoid single points of failure.

As mentioned above, in one aspect, some embodiments may employ a computer system such as the computer system 1100 to perform methods in accordance with various embodiments of the technology. According to a set of embodiments, some or all of the procedures of such methods are performed by the computer system 1100 in response to processor 1110 executing one or more sequences of one or more instructions, which might be incorporated into the operating system 1140 and/or other code, such as an application program 1145, contained in the working memory 1135. Such instructions may be read into the working memory 1135 from another computer-readable medium, such as one or more of the storage device(s) 1125. Merely by way of example, execution of the sequences of instructions contained in the working memory 1135 might cause the processor(s) 1110 to perform one or more procedures of the methods described herein. Additionally or alternatively, portions of the methods described herein may be executed through specialized hardware.

In the foregoing description, for the purposes of explanation, numerous specific details were set forth in order to provide a thorough understanding of various embodiments of the present invention. It will be apparent, however, to one skilled in the art that embodiments of the present invention may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of the exemplary embodiments will provide those skilled in the art with an enabling description for implementing an exemplary embodiment. It should be understood that various changes may be made in the function and arrangement of elements without departing from the spirit and scope of the invention as set forth in the appended claims.

Specific details are given in the foregoing description to provide a thorough understanding of the embodiments. However, it will be understood by one of ordinary skill in the art that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, aspects of the invention are described with reference to specific embodiments thereof, but those skilled in the art will recognize that the invention is not limited thereto. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. An energy virtualization system comprising:
a physical interface gateway comprising a plurality of common interfaces, wherein the plurality of common interfaces are coupled to:
a plurality of energy-producing devices;
a plurality of energy-control devices; and
a plurality of energy-consuming devices;
a building network, wherein the plurality of energy-producing devices, the plurality of energy-control devices, and the plurality of energy-consuming devices communicate through the building network; and
a computing device running an energy virtualization layer, wherein:
the virtualization layer comprises a plurality of virtual devices representing the plurality of energy-producing devices, the plurality of energy-control devices, and the plurality of energy-consuming devices;
the virtualization layer is distributed across a plurality of computing devices and acts as a hypervisor layer for the plurality of virtual devices;
the virtualization layer selects and controls which of the energy-producing devices provide energy to specific ones of the energy-consuming devices according to information received from the energy-control devices; and
the virtualization layer is configured to:
poll the plurality of virtual devices to determine device statuses;
receive an indication that a new device has been connected to the physical interface gateway;
receive information associated with a profile from the new device;
using the profile, determine whether the new device is an energy-producing device, an energy-control device, or an energy-consuming device based at least in part on the profile received from the new device;
determine whether the new device is authorized; and
interface with the new device if the new device is authorized according to the profile.

2. The energy virtualization system of claim 1, wherein the plurality of energy-producing devices, the plurality of energy-control devices, and the plurality of energy-consuming devices communicate through building network according to an IP protocol.

3. The energy virtualization system of claim 1, wherein the energy virtualization system is installed in a commercial building.

4. The energy virtualization system of claim 1, wherein the energy virtualization system is installed in a residential building.

5. The energy virtualization system of claim 1, wherein the plurality of energy-consuming devices comprises an electric vehicle.

6. The energy virtualization system of claim 1, wherein the profile comprises an operating current and voltage for the new device.

7. The energy virtualization system of claim 6, wherein the operating current and voltage for the new device are supplied by the new device to the energy virtualization system.

8. The energy virtualization system of claim 6, wherein the operating current and voltage for the new device are provided to the new device from the energy virtualization system.

9. The energy virtualization system of claim 1, wherein the plurality of energy-consuming devices comprises a heating, ventilation, and air conditioning (HVAC) system.

10. A method of operating an energy virtualization system, the method comprising:
receiving a plurality of energy-producing devices through a plurality of common interfaces in a physical interface gateway of the energy virtualization system;
receiving a plurality of energy-control devices through a plurality of common interfaces in a physical interface gateway of the energy virtualization system;
receiving a plurality of energy-consuming devices through a plurality of common interfaces in a physical interface gateway of the energy virtualization system;
communicating between the plurality of energy-producing devices, the plurality of energy-control devices, and the plurality of energy-consuming devices through a building network;
representing the plurality of energy-producing devices, the plurality of energy-control devices, and the plurality of energy-consuming devices as a plurality of virtual devices on a virtualization layer running on a computing device, wherein the virtualization layer is distributed across a plurality of computing devices and acts as a hypervisor layer for the plurality of virtual devices;

selecting, by the virtualization layer, and controlling which of the energy-producing devices provide energy to specific ones of the energy-consuming devices according to information received from the energy-control devices;

polling, by the virtualization layer, the plurality of virtual devices to determine device statuses;

receiving, by the virtualization layer, an indication that a new device has been connected to the physical interface gateway;

receiving by the virtualization layer, information associated with a profile from the new device;

using the profile, determining, by the virtualization layer, whether the new device is an energy-producing device, an energy-control device, or an energy-consuming device based at least in part on the profile received from the new device;

determining, by the virtualization layer, whether the new device is authorized; and interfacing, by the virtualization layer, with the new device if the new device is authorized according to the profile.

11. The method of claim 10, wherein the plurality of energy-producing devices, the plurality of energy-control devices, and the plurality of energy-consuming devices communicate through building network according to an IP protocol.

12. The method of claim 10, wherein the energy virtualization system is installed in a commercial building.

13. The method of claim 10, wherein the energy virtualization system is installed in a residential building.

14. The method of claim 10, wherein the plurality of energy-consuming devices comprises an electric vehicle.

15. The method of claim 10, wherein the profile comprises an operating current and voltage for the new device.

16. The method of claim 15, wherein the operating current and voltage for the new device are supplied by the new device to the energy virtualization system.

17. The method of claim 15, wherein the operating current and voltage for the new device are provided to the new device from the energy virtualization system.

18. The method of claim 15, wherein the plurality of energy-consuming devices comprises a heating, ventilation, and air conditioning (HVAC) system.

* * * * *